United States Patent [19]

Clinton et al.

[11] Patent Number: 5,132,629

[45] Date of Patent: Jul. 21, 1992

[54] APPARATUS FOR TESTING THE INSULATION OF AN ELECTRICAL CONDUCTOR PASSING THROUGH AN ELECTRODE

[75] Inventors: Henry H. Clinton; Theodore P. Lane, both of Clinton, Conn.

[73] Assignee: Clinton Instrument Company, Clinton, Conn.

[21] Appl. No.: 660,634

[22] Filed: Feb. 25, 1991

[51] Int. Cl.⁵ .................. G01R 31/02; G01R 31/14
[52] U.S. Cl. ..................................... 324/544; 324/551
[58] Field of Search ................ 324/544, 551, 548, 536

[56] References Cited

U.S. PATENT DOCUMENTS

| | | | |
|---|---|---|---|
| 3,418,570 | 12/1968 | Clinton | 324/515 |
| 3,430,137 | 2/1969 | Eager et al. | 324/544 |
| 3,510,763 | 5/1970 | Clinton | 324/544 |
| 4,117,397 | 9/1978 | Fukao et al. | 324/536 |
| 4,291,204 | 9/1981 | Crick | 324/536 |
| 4,952,880 | 8/1990 | Clinton | 324/544 |

Primary Examiner—Kenneth A. Wieder
Assistant Examiner—Maura K. Regan
Attorney, Agent, or Firm—McCormick, Paulding & Huber

[57] ABSTRACT

Apparatus for testing the insulation on an insulated conductor wherein a high AC test voltage is applied to an electrode through which the insulated conductor is passing is presented and includes a testing station for applying the high AC test voltage potential to an electrode at a desired magnitude and frequency. Current induced in the electrode due to corona effects or arc current pulses due to a defect in the insulation are sensed by a current sensing transformed circuit to develop a insulation condition voltage signal. The insulation condition voltage signal together with a low voltage test signal proportional to the magnitude of the high AC test voltage potential are coupled to a remotely located controlled unit. A negative peak detector receives the low voltage potential to produce a bias voltage at the input to the fault detection circuit. The characteristics of the current sensing transformed circuit are such that current induced in the test electrode due to corona effects are shunted to ground reference voltage potential. Arc current pulses induced in the test electrode cause the insulation condition voltage signal to be produced at sufficient magnitude to exceed the bias voltage at the control unit and cause the fault detection circuit to provide a fault indication signal representation of a flaw or defect in the insulation of the portion of the insulated electrical conductor within the test electrode.

7 Claims, 1 Drawing Sheet

APPARATUS FOR TESTING THE INSULATION OF AN ELECTRICAL CONDUCTOR PASSING THROUGH AN ELECTRODE

BACKGROUND OF THE INVENTION

The present invention relates generally to fault testing of insulation applied to a cable, wire or other elongated electrical conductor and deals more particularly with an improved insulation testing apparatus of the type wherein an alternating current high test voltage is applied between the insulation and the conductor to reveal holes, voids or other imperfections in the insulation.

Insulated electrical conductors, such as wire or cable, are usually subjected to a high voltage test prior to use as a check against any unseen imperfections which may be present in the insulation. This test may be made either as the insulation is extruded onto the conductor or may be performed in some subsequent operation. Generally, the insulated conductor, the conductor of which is suitably grounded, is passed through an electrode of some type which applies a high voltage to the outer surface of the insulation. Testing apparatus of this type is disclosed in U.S. Pat. Nos. 3,418,570; 3,510,763; 3,514,696; and 4,952,880 issued to Clinton and to which patents reference may be made for a detail description of such testing devices and which disclosures are incorporated herein by reference.

In the AC testing of insulated wire or cable by means of an in-line application of a high test voltage applied between an electrode around the outside of the insulation and the grounded conductor, it is desirable to detect the smallest possible arc from the electrode to the conductor through a pin hole, crevice or other imperfection in the insulation.

Additionally, it is also desirable to prevent the normal corona discharge which occurs in the air spaces between the elements of the electrode and the insulation surface from producing erroneous indications of a fault condition by the detecting means.

A drawback of known testing apparatus is that their designs are such to compromise low current arc sensitivity to achieve a measure of immunity to corona discharge.

A further drawback to known testing apparatus is the sensitivity of the detectors used are degraded by the capacitance in the cable linking the high voltage transformer to the remotely located fault detector.

It is further desirable that the control unit or fault detecting means in such testing apparatus be separate and remotely located from the testing station and the high voltage potential transformer used to excite the electrode by distances of up to 100 meters without degradation of performance of the apparatus.

It is a general aim therefore of the present invention to provide an enhanced sensitivity to low current fault arcs while preventing normal corona discharge from being erroneously detected as a insulation fault.

It is a further aim of the present invention to locate the fault detection means at some distance from the high voltage transformer without altering the detection characteristics of the fault detection means.

SUMMARY OF THE INVENTION

Apparatus for testing the insulation of an insulated electrical conductor passing through an electrode is presented in accordance with the present invention wherein a high frequency AC test voltage produced by a high voltage potential transformer is coupled to an electrode which is in proximity to the surface of the insulation of the portion of the insulated conductor within the electrode. Current sensing means coupled in series with the high voltage potential transformer and test electrode senses electrical current induced in the test electrode and develops an insulation condition voltage signal representative of the condition of the insulation of the insulated conductor within the test electrode. The high voltage potential transformer has a low voltage winding for producing a low test voltage potential signal at the test frequency.

A control unit located remotely from the testing station is coupled to the current sensing means by way of a twisted wire pair to couple an insulation condition voltage signal developed by the current sensing means to the control unit. A fault condition voltage signal proportional to the magnitude of the insulation condition voltage signal is developed by the current sensing means. The AC low test voltage signal is also coupled to the control unit and a bias voltage potential proportional to the magnitude of the high test voltage is developed and coupled to the fault detection circuit means. The fault detection circuit means produces a fault indication signal in response to the magnitude of the fault condition voltage signal exceeding the magnitude of the bias voltage potential whereby fault in the insulation of an insulated conductor within the test electrode is detected.

The characteristics of the current sensing means are such that current induced in the test electrode due to corona effects are shunted to ground reference voltage potential due to the frequency characteristics of the current sensing means. In contrast, current induced in the test electrode due to arc current pulses caused by the presence of a fault or defect in the insulation of an insulated electrical conductor within the test electrode are sensed by the current sensing means and an insulation condition voltage signal sufficient to overcome the bias voltage potential and cause the fault detection circuit means to produce a fault indication signal.

BRIEF DESCRIPTION OF THE DRAWINGS

Other features and advantages of the present invention will become readily apparent from the following written description taken in conjunction with the following drawing wherein.

DETAILED DESCRIPTION OF THE PREFERRED EMBODIMENT

Figure 1:
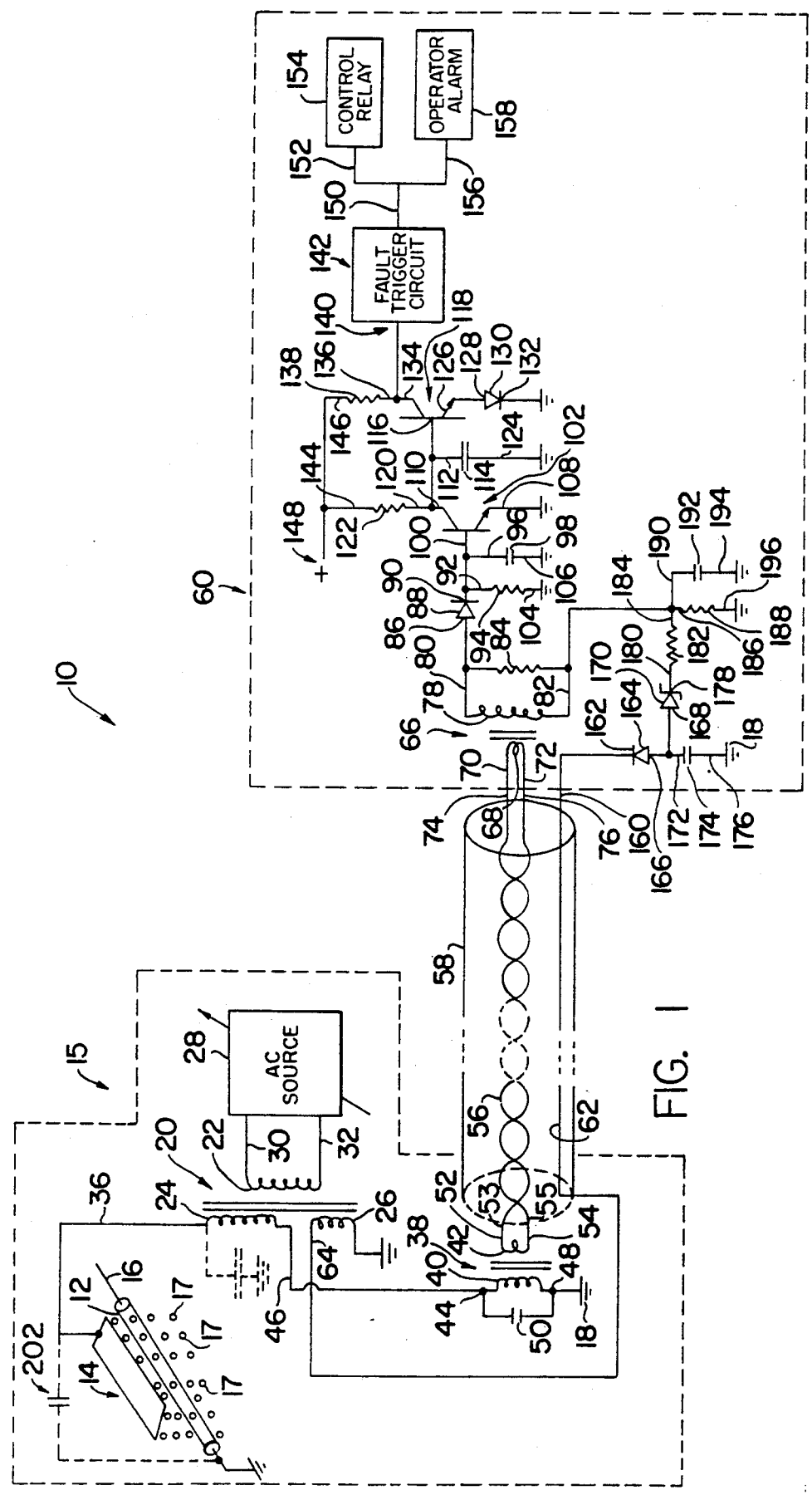
FIG. 1 is an electrical circuit schematic diagram showing one embodiment of the insulation testing apparatus of the present invention.

Turning now to the drawing and considering the invention in further detail, FIG. 1 is an electrical circuit schematic diagram of the insulation testing apparatus of the present invention and is generally designated 10. An insulated electrical conductor 12 is passed through a test electrode generally designated 14 and located at a testing station generally designated 15. The actual conducting portion 16 of the conductor 12 under test may be grounded to a ground reference voltage potential 18. The test electrode 14 may take various forms and for example, may be a generally conventional bead chain as illustrated or a flare mouth electrode or other form generally well known to those skilled in the art.

In the illustration of FIG. 1, the various circuit components and parts of the testing device are shown arranged and interconnected and are usually contained within a protective enclosure (not shown). The testing station 15 of the apparatus 10 includes a high voltage potential transformer generally designated 20 and includes a primary winding 22, a high voltage secondary winding 24 and a low voltage secondary winding 26. An AC source represented by the function block 28 is connected to the terminals 30,32 of the primary winding 22 and is used to excite the high voltage transformer 20. One end 34 of the high voltage secondary winding 24 is connected to the electrode 14 by the conductor 36 to apply a high AC voltage to the electrode 14. The AC source 28 is adjustable to provide an output excitation voltage at a desired test frequency and at a desired magnitude to cause the high voltage potential transformer to produce a desired AC high test voltage potential.

A current sensing transformer generally designated 38 includes a primary winding 40 and a secondary winding 42. One end 44 of the primary winding 40 is connected to the low potential end 46 of the high voltage secondary winding 24 of the transformer 20. The opposite end 48 of the primary winding 40 is connected to the ground reference potential 18. A small value capacitor 50 is connected in parallel with the primary winding 40 across the terminals 44 and 48. The current sensing transformer 38 is typically and preferably made of a ferrite core construction with operating characteristics to permit efficient transformation of current and voltage at frequencies above 30 kilohertz and very inefficient transformation of current and voltage at frequencies below 10 kilohertz which is the typical testing frequency generated by the AC source 28.

The secondary winding 42 of the current transformer 38 has its respective ends 52,54 connected to the ends 53,55 of a twisted wire pair designated 56 which twisted pair is contained in a connecting cable or protective sheath 58. The connecting cable 58 electrically connects the testing station and the portion of the testing apparatus located near the electrode 14 to the control portion shown generally in the dashline box 60 of the testing apparatus which is located some distance remote from the electrode. An additional wire 62 in the conductor 58 has one end connected to the end 64 of the low voltage secondary winding 26 of the high voltage potential transformer 20.

The control portion 60 includes a transformer generally designated 66 which is similar in design and characteristics to the current sensing transformer 38. The primary winding 68 of the transformer 66 has its respective ends 70,72 connected to ends 74,76 respectively of the twisted wire pair 56. The transformer 66 includes a secondary winding 78 across which respective ends 80,82 a resistor 84 is connected in parallel. The value of the resistor 84 is selected to cause the primary winding 68 of the transformer 66 to present an impedance match to the twisted pair 56 such that the characteristics of the transformer 66 match the characteristic impedance of the twisted pair at frequencies above 30 kilohertz.

The end 80 of the secondary winding 78 of transformer 66 is connected to the anode 86 of the diode 88. The cathode 90 of diode 88 is connected to one end 92 of resistor 94 and one end 96 of capacitor 98 and to the base terminal 100 of the NPN transistor 102. The end 104 of resistor 94 and end 106 of capacitor 98 and the emitter terminal 108 of the transistor 102 are connected to ground reference voltage potential 18. The collector terminal 110 of the transistor 102 is connected to one end 112 of capacitor 114, the base terminal 116 of the NPN transistor 118 and to one end 120 of resistor 122. The opposite end 124 of the capacitor 114 is connected to the ground reference voltage potential 18. The emitter terminal 126 of the transistor 118 is connected to the anode 128 of diode 130 and to ground reference voltage potential 18 via the cathode 132 of the diode 130. The collector terminal 134 of the transistor 118 is connected to one end 136 of resistor 138 and to the input 140 of a fault trigger circuit shown generally by the function block 142. The ends 144 and 146 of the resistors 122 and 138, respectively are connected to a positive DC voltage potential generally designated 148.

The output 150 of the fault trigger circuit means 142 is connected to the input 152 of a process control relay shown generally by the function block 154 and to the input 156 of an operator alarm device shown generally by the function block 158. The fault trigger circuit 142 generates an output voltage pulse of a predetermined duration in response to a positive voltage pulse present at its input 140 and which output pulse operates the process control relay 154 and actuates the operator alarm 158.

One end 160 of the wire 62 contained within the connecting cable 58 is connected to the cathode 162 of the diode 164. The anode 166 of the diode 164 is connected to the anode 168 of the zener diode 170 and to one end 172 of capacitor 174. The opposite end 176 of the capacitor 174 is connected to the ground reference voltage potential 18. The anode 178 of the zener diode 170 is connected to one end 180 of resistor 182. The opposite end 184 of the resistor 182 is connected to one end 186 of resistor 188 and to one end 190 of capacitor 192 and to one end 82 of the secondary winding 78 of the transformer 66. The opposite ends 194 and 196 of capacitor 192 and resistor 188 respectively are connected to the ground reference voltage potential 18.

When the testing apparatus 10 is operated, the AC source 28 energizes the high voltage potential transformer 20 causing it to apply a high AC test voltage between the electrode 14 and the conductor 16 of the insulated conductor 12 being tested. It can be seen that the circuit is completed from the electrode 14 through the high voltage secondary winding 24 through the primary winding 40 of transformer 38 to the ground reference voltage potential 18 and accordingly, to the conductor 16 of the insulated conductor 12 under test.

If the insulation of the conductor 12 under test does not have a defect, any current flowing in the secondary winding 24 is due to reactive current flow through wiring capacitance shown in phantom and designated generally 200, and the reactive current through the capacitance 202 also shown in phantom and which capacitance 202 represents the capacitance of the length of insulated conductor 12 within the electrode 14. Superimposed on the current flowing in the winding 24 are short pulses of random polarity, duration and time spacing intervals due to the ionization of the air spaces between the bead chain elements 17,17 of the electrode 14 and the surface of the insulation of the cable 12 under test. The short duration pulses are characterized by fast rise times and low average energy content.

Any current flowing in the secondary winding 24 of the transformer 20 flows through the primary winding 40 of the transformer 38 apart from a substantial portion of the corona caused current pulses which flow through the capacitor 50 to the ground reference voltage potential 18. As a result of the shunting of corona caused current pulses away from the winding 40, relatively little voltage is induced in the secondary winding 42 of the transformer 38. Additionally, due to the desired characteristics of the transformer 38 to attenuate the low frequencies generally used for testing purposes, the reactive current due to the wiring capacitance 200 and capacitance 202 of the cable under test and which flows in the winding 40 of the transformer 38 does not produce a significant voltage in the secondary winding 42 of the transformer 38.

The relatively small magnitude of the corona caused voltage induced in the winding 40 is transmitted over the twisted wire pair 56 which functions as a transmission line terminated in its characteristic impedance by the action of the transformer 66 and resistor 84. Any remaining voltage at the test frequency transmitted over the twisted pair 56 is further attenuated by the transformer 66 and is rendered negligible at the secondary winding 78.

A low voltage at the test frequency is coupled from the low voltage winding 26 of the high voltage transformer 20 to a negative peak rectifier formed by the diode 164 to charge the capacitor 174 to produce a negative DC voltage potential proportional to the high voltage test potential produced across the winding 24 of the transformer 20. The negative voltage potential developed across the capacitor 174 is further reduced by the voltage drop across the zener diode 170 and a portion of the reduced voltage which is determined by the voltage divider action of resistors 182 and 188 is applied to the end 82 of the secondary winding 78 of the transformer 66. The voltage magnitude determined by the voltage divider is accordingly applied to the anode 86 of the diode 88 as a negative offset or delay bias voltage which prevents the diode 88 from conducting until the induced voltage across the winding 78 exceeds this bias value. The offset voltage is therefore automatically adjusted to prevent diode 88 from conducting at any of the various test voltages used and at any condition of corona in the electrode 14. The transistor 102 is in a' nonconductive state and transistor 118 is held in conduction by the resistor 122 causing the collector 134 of the transistor 118 to remain at a level of approximately one volt. With approximately one volt present at the collector 134 of the transistor 118, sufficient voltage is not present to operate the fault trigger circuit 142 and accordingly, no fault indication would be indicated to the operator.

The value of resistor 94 is chosen to fix the voltage potential at the base 100 of the transistor 102 at zero. The value of capacitor 98 is selected to prevent the voltage potential at the base 100 of the transistor 102 from being influenced by extraneous electric fields which may occur during the testing process.

In the instance where a fault or defect in the insulation of the conductor 12 is within the electrode 14, an arc will occur from the electrode 14 to the conductor 16 of the insulated conductor 12. The current flowing in the arc is highly dependent on the geometry of both the fault or defect in the insulation itself and the electrode-air interface but, in any event at least one pulse of current is generated which has a short rise time and a magnitude dependent upon the arc current.

The arc current pulse or pulses produced due to the defect in the insulation in the insulated cable within the electrode flows through the secondary winding 24 and through the secondary winding 40 of the current transformer 38. The frequency spectrum of these arc current pulses are generally within the efficient range of operation of the transformers 38 and 66. The arc current pulses are propagated into the twisted wire pair 56 and appear across the transformer winding 68 of the transformer 66 without distortion independent of the length of the connecting cable 58. In general, these arc current pulses are of a greater magnitude and a longer duration than the corona pulses and are generally not effected very much by the action of the capacitor 50. As a result, the voltage induced in the transformer winding 78 exceeds the negative offset bias voltage and the voltage drop of the diode 88. The diode 88 will now conduct current to the base 100 of the transistor 102 causing the transistor to become conductive to discharge the capacitor 114 and to interrupt the current flowing to the base terminal 116 of the transistor 118 causing the transistor to become nonconductive. The voltage potential at the collector terminal of the transistor 118 will rise to the magnitude of the voltage potential 148 and remain at that voltage potential for a minimum time defined by the RC time constant developed by the values of resistor 122 and capacitor 114. The rise in the voltage potential at the collector terminal 134 of the transistor 118 triggers the fault trigger circuit 142 which generates a current pulse at its output 150 of a time duration sufficient to operate the process control relay 154 and the operator alarm 158.

Apparatus for testing flaws in the insulation of an electrical conductor passing through an electrode has been described above in a preferred embodiment. It will be recognized that numerous changes and modifications may be made to the values of the various circuit components and also to the configuration of the functioning circuits without departing from the scope of the invention. Therefore, the invention has been described by way of illustration rather than limitation.

We claim:

1. Apparatus for testing the insulation on an insulated conductor and for use with an electrode through which the conductor is passed with a continuous motion and adapted to apply a high AC test voltage to the portion of such insulation instantaneously received therein, said apparatus comprising:
   a testing station including:
   means defining a test electrode;
   means coupled to said test electrode for producing a high AC test voltage;
   AC voltage signal source means coupled to said AC high voltage producing means to excite said high voltage producing means to generate said high test voltage at a desired magnitude and frequency;
   current sensing means coupled in series with said high voltage producing means and said test electrode for sensing an electrical current induced in the test electrode and for developing an insulation condition voltage signal representative of the condition of the insulation of an insulated conductor within said test electrode;
   said high AC test voltage producing means having second means for producing a low test voltage potential signal at the frequency of said AC voltage signal source, and
   a control unit located remotely from said testing station and including:
   first circuit means for receiving said AC low test voltage signal and for developing a bias voltage potential proportional to the magnitude of said high test voltage, and second circuit means having receiving circuit means for receiving said insulation condition voltage signal developed by said current sensing means and for producing a fault condition voltage signal proportional to the magnitude of said insulation condition voltage signal developed by said current sensing means, and fault detection circuit means for producing a fault indication signal in response to the magnitude of said fault condition voltage signal exceeding the magnitude of said bias voltage potential whereby a fault in the insulation of an insulated conductor within the test electrode is detected.

2. Apparatus for testing insulation as defined in claim 1 further characterized by said current sensing means being connected to a ground reference voltage potential and including electrical current shunting means for diverting to said ground reference voltage potential a substantial portion of the electrical current induced in the test electrode from corona effects between said test electrode and the surface of an insulated conductor within said electrode whereby the magnitude of said insulation condition voltage signal developed is insufficient to cause said fault detection circuit means to indicate a fault condition, and for developing an insulation condition voltage signal whose magnitude is sufficient to cause said fault detection circuit means to indicate a fault condition when the electrical current induced in the test electrode is at least one current arc pulse due to a defect in the insulation of the insulated conductor within the test electrode.

3. Apparatus for testing insulation as defined in claim 1 further characterized by:
said current sensing means comprising a first current transformer having a primary and secondary winding;
said control unit second circuit means including a transformer having a primary and secondary winding;
connecting means for coupling said testing station to said control unit, said connecting means including:
a twisted wire pair having one pair end connected across the secondary winding of said current transformer and the other pair end connected across the primary winding of said control unit transformer and a single wire having one end connected to said AC low test voltage potential producing means and the other end to said control unit first circuit means;
said control unit transformer further including means for adjusting its impedance characteristics to match the impedance of said twisted wire pair and said current transformer.

4. Apparatus for testing insulation as defined in claim 1 further characterized in that said control unit first circuit means further comprises:
negative peak rectifier circuit means coupled to a first capacitor for charging the capacitor to a negative DC voltage potential in response to said AC low test voltage being present at said control unit, and zener diode circuit means connected in electrical series with said negative peak rectifier and a resistive voltage divider circuit means, said voltage bias potential having a variable magnitude and being defined by said negative DC voltage potential minus the value of the voltage drop across said zener diode circuit means and the ratio of said resistive voltage divider network.

5. Apparatus for testing insulation as defined in claim 4 further characterized by said control unit second circuit means having the secondary winding of said transformer connected in electrical series between the output of said resistive voltage divider and a diode arranged with its anode connected to the end of the secondary winding not connected to said voltage divider output, the cathode of said diode being coupled to said fault detection circuit means to cause said detection circuit means to produce said fault indication signal in response to the magnitude of said fault condition voltage signal causing said diode to become forward biased.

6. Apparatus for testing insulation as defined in claim 5 further characterized by said fault detection circuit means including switching circuit means for providing an activation signal to an external device such as an operator alarm or controller used in the processing of the insulated conductor during manufacturing and testing.

7. Apparatus for testing the insulation of an insulated conductor, said apparatus comprising:
a source of alternating current (AC) high voltage potential test signals for producing a test voltage at a desired magnitude and test frequency;
test electrode means coupled to said AC high voltage test signal source for applying said AC high voltage test signal to the portion of such insulation received within said test electrode;
means for sensing an electrical current induced in said test electrode due to corona effects and due to defects in the insulation of the insulated conductor under test, said sensing means further having means for discriminating corona caused current and arc current pulses due to a defect in the insulation, said sensing means having means for producing a voltage signal representative of and proportional to the magnitude of said sensed electrical current, and
means responsive to said sensing means for producing a fault indication signal and for producing an automatically adjustable variable magnitude threshold voltage signal, said threshold voltage signal magnitude being directly proportional to the relative magnitude of said AC high voltage test signal, said fault indication producing means producing said fault indication signal in response to said sensed electrical current voltage signal having a magnitude exceeding said threshold voltage signal magnitude.

* * * * *